US012795909B2

(12) United States Patent
Kim et al.

(10) Patent No.: US 12,795,909 B2
(45) Date of Patent: Nov. 10, 2026

(54) METHOD OF MAKING MEMORY CELLS, TRANSISTOR DEVICES AND LOGIC DEVICES ON SILICON-ON-INSULATOR SUBSTRATE

(71) Applicant: Silicon Storage Technology, Inc., San Jose, CA (US)

(72) Inventors: Jinho Kim, San Jose, CA (US); Xian Liu, Sunnyvale, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 360 days.

(21) Appl. No.: 18/582,612

(22) Filed: Feb. 20, 2024

(65) Prior Publication Data

US 2025/0194086 A1 Jun. 12, 2025

Related U.S. Application Data

(60) Provisional application No. 63/606,921, filed on Dec. 6, 2023.

(51) Int. Cl.
*H10B 41/27* (2023.01)
*H10D 30/01* (2025.01)
*H10D 30/68* (2025.01)

(52) U.S. Cl.
CPC ......... *H10B 41/27* (2023.02); *H10D 30/0411* (2025.01); *H10D 30/68* (2025.01); *H10D 30/6891* (2025.01)

(58) Field of Classification Search
CPC . H10D 30/0411; H10D 30/68; H10D 30/6891
See application file for complete search history.

(56) References Cited

U.S. PATENT DOCUMENTS 4,771,016 A 9/1988 Bajor et al.
5,061,642 A 10/1991 Fujioka
(Continued)

FOREIGN PATENT DOCUMENTS

TW 202347616 A 12/2023

OTHER PUBLICATIONS

Taiwanese Office Action mailed on Jul. 22, 2025 corresponding to the related Taiwanese Patent Application No. 113144361.
(Continued)

*Primary Examiner* — Trang Q Tran
(74) *Attorney, Agent, or Firm* — DLA Piper LLP (US)

(57) ABSTRACT

A method of forming a semiconductor device by providing a substrate having bulk silicon, an insulation layer over the bulk silicon, and a silicon layer over the insulation layer. The silicon and insulation layers are removed from first and second areas, while maintained in a third area. A memory cell is formed in the first area having a floating gate over a first portion of a memory cell channel region and a control gate over a second portion of the memory cell channel region. A transistor device is formed in the second area having a transistor gate over a transistor channel region. A logic device is formed in the third area having a logic device gate over a logic device channel region. The memory cell channel region and the transistor channel region are disposed in the bulk silicon. The logic device channel region is disposed in the silicon layer.

6 Claims, 4 Drawing Sheets

(56) References Cited

U.S. PATENT DOCUMENTS

| | | | | |
|---|---|---|---|---|
| 5,417,180 | A | 5/1995 | Nakamura | |
| 5,888,297 | A | 3/1999 | Ogura | |
| 6,338,993 | B1 | 1/2002 | Lien | |
| 6,348,378 | B1 * | 2/2002 | Lee | H10B 41/40<br>438/257 |
| 6,403,486 | B1 | 6/2002 | Lou | |
| 6,747,310 | B2 | 6/2004 | Fan et al. | |
| 7,049,661 | B2 | 5/2006 | Yamada et al. | |
| 7,868,375 | B2 | 1/2011 | Liu et al. | |
| 7,927,994 | B1 | 4/2011 | Liu et al. | |
| 9,202,761 | B2 | 12/2015 | Makiyama et al. | |
| 9,431,407 | B2 | 8/2016 | Su et al. | |
| 10,490,496 | B2 | 11/2019 | Kawashima | |
| 2004/0156236 | A1 | 8/2004 | Masuoka | |
| 2012/0181609 | A1 | 7/2012 | Enders | |
| 2016/0020219 | A1 * | 1/2016 | Chuang | H10D 87/00<br>438/151 |
| 2019/0348427 | A1 | 11/2019 | Kim | |

OTHER PUBLICATIONS

PCT Search Report and Written Opinion mailed on Aug. 21, 2024 corresponding to the related PCT Patent Application No. PCT/US2024/019271.

Chandra Zefanya et al: "Split-Gate Flash Memory: from Planar to 3D," 2021 International Symposium on Electronic and Smart Devices (ISESD), IEEE, Jun. 29, 2021, pp. 1-5, XP033958207, DOI: 10.1109/ISESD53023.2021.9501739.

* cited by examiner

METHOD OF MAKING MEMORY CELLS, TRANSISTOR DEVICES AND LOGIC DEVICES ON SILICON-ON-INSULATOR SUBSTRATE

RELATED APPLICATIONS

This application claims the benefit of U.S. Provisional Application No. 63/606,921, filed Dec. 6, 2023, and which is incorporated herein by reference.

FIELD OF THE INVENTION

The present invention relates to embedded non-volatile memory devices.

BACKGROUND OF THE INVENTION

Split-gate type non-volatile memory cell arrays are known. For example, U.S. Pat. No. 5,029,130, which is incorporated herein by reference for all purposes, discloses a split gate memory cell and its formation, which includes forming source and drain regions in the substrate with a channel region there between. A floating gate is disposed over (i.e., vertically over and laterally overlapping) and controls the conductivity of one portion of the channel region, and a control gate is disposed over and controls the conductivity of the other portion of the channel region. The control gate extends up and over the floating gate. The insulation between the floating gate and the control gate is referred to as the tunnel dielectric material because electrons tunnel through this dielectric material during an erase operation. The tunnel dielectric can be an oxide (e.g. silicon dioxide, silicon oxide, or a combination of both).

Silicon on insulator (SOI) devices are well known in the art of microelectronics. SOI devices differ from bulk silicon substrate devices in that the substrate is layered with an embedded insulating layer under the silicon surface (i.e. silicon-insulator-silicon) instead of being solid silicon. With SOI devices, the silicon junctions are formed in a silicon layer disposed over the electrical insulator that is embedded in the silicon substrate. As a non-limiting example, the silicon layer can have a thickness of 30-500 Å (Angstroms). The insulator is typically oxide. This substrate configuration reduces parasitic device capacitance, thereby improving performance. SOI substrates can be manufactured by SIMOX (separation by implantation of oxygen using an oxygen ion beam implantation—see for example U.S. Pat. Nos. 5,888,297 and 5,061,642), wafer bonding (bonding oxidized silicon with a second substrate and removing most of the second substrate—see for example U.S. Pat. No. 4,771,016), or seeding (topmost silicon layer grown directly on the insulator—see for example U.S. Pat. No. 5,417,180). These four patents are incorporated herein by reference for all purposes.

It is known to form transistor devices and logic devices on the same substrate as non-volatile memory devices (i.e. typically referred to as embedded memory devices). Transistor devices can also be referred to as high voltage devices, because they have a higher operational voltage than do the logic devices. As device geometries continue to shrink, logic devices could benefit greatly from the advantages of SOI substrates. However, the non-volatile memory devices and transistor devices are not conducive to SOI substrates because they require deeper source and drain regions than the thickness of the silicon layer. There is a need to combine the advantages of logic devices formed on an SOI substrate with memory devices and transistor devices formed on bulk substrates.

BRIEF SUMMARY OF THE INVENTION

The aforementioned problems and needs are addressed by a method of forming a semiconductor device that includes:

- providing a substrate that includes bulk silicon, an insulation layer over the bulk silicon, and a silicon layer over the insulation layer;
- performing an etch process to remove the silicon layer and the insulation layer from a first area and a second area of the substrate to expose the bulk silicon in the first area and the second area of the substrate, while maintaining the insulation layer and the silicon layer in a third area of the substrate;
- forming a memory cell in the first area by:
  - forming a memory cell source region and a memory cell drain region in the bulk silicon, with a memory cell channel region of the bulk silicon extending between the memory cell source region and the memory cell drain region,
  - forming a floating gate disposed over and insulated from a first portion of the memory cell channel region, and
  - forming a control gate disposed over and insulated from a second portion of the memory cell channel region;
- forming a transistor device in the second area by:
  - forming a transistor source region and a transistor drain region in the bulk silicon, with a transistor channel region of the bulk silicon extending between the transistor source region and the transistor drain region, and
  - forming a transistor gate disposed over and insulated from the transistor channel region; and
- forming a logic device in the third area by:
  - forming a logic device source region and a logic device drain region in the silicon layer, with a logic device channel region of the silicon layer extending between the logic device source region and the logic device drain region, and
  - forming a logic gate disposed over and insulated from the logic device channel region.

A semiconductor device includes:

- a substrate of bulk silicon and having a first area, a second area and a third area,
  - an insulation layer disposed over the bulk silicon, and a silicon layer disposed over the insulation layer, in the third area of the substrate, wherein the silicon layer and the insulation layer are not present in the first area and the second area of the substrate;
- a memory cell in the first area comprising:
  - a memory cell source region and a memory cell drain region in the bulk silicon, with a memory cell channel region of the bulk silicon extending between the memory cell source region and the memory cell drain region,
  - a floating gate disposed over and insulated from a first portion of the memory cell channel region, and
  - a control gate disposed over and insulated from a second portion of the memory cell channel region;
- a transistor device in the second area comprising:
  - a transistor source region and a transistor drain region in the bulk silicon, with a transistor channel region of the bulk silicon extending between the transistor source region and the transistor drain region, and a transistor gate disposed over and insulated from the transistor channel region; and a logic device in the third area comprising:

a logic device source region and a logic device drain region in the silicon layer, with a logic device channel region of the silicon layer extending between the logic device source region and the logic device drain region, and a logic gate disposed over and insulated from the logic device channel region.

Other objects and features of the present disclosure will become apparent by a review of the specification, claims and appended figures.

DETAILED DESCRIPTION OF THE INVENTION

Figure 1:
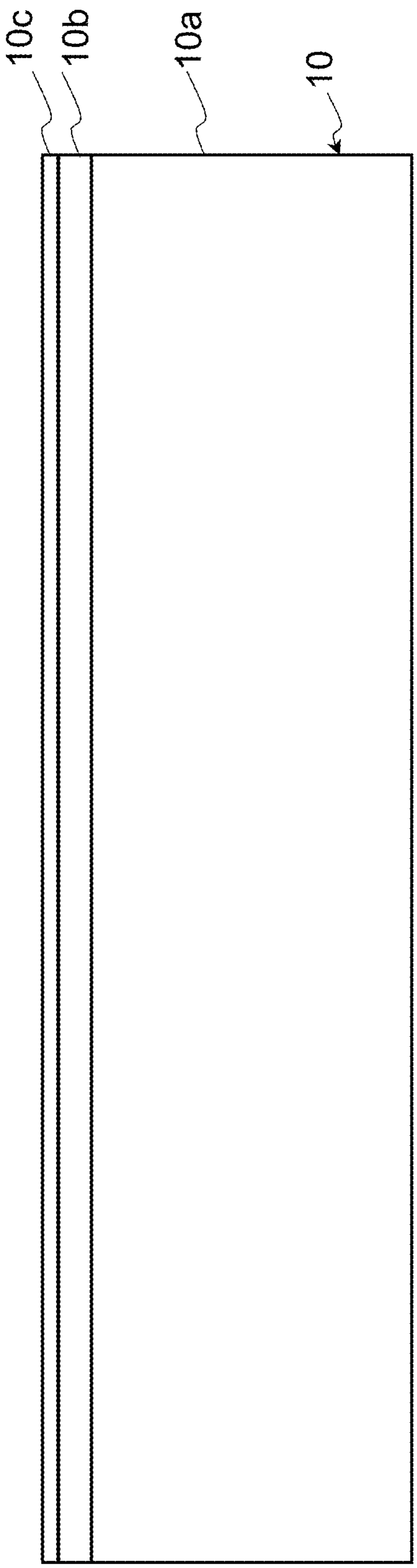
FIG. 1 is a side cross sectional view illustrating a silicon on insulator (SOI) substrate.

The present example is a process of forming a semiconductor device, in which split gate non-volatile memory cells and transistor devices are formed alongside logic devices on a silicon on insulator substrate, also referred to herein as an SOI substrate. The process begins by providing an SOI substrate 10, as illustrated in FIG. 1. The SOI substrate includes three portions: bulk silicon 10*a*, an insulation layer 10*b* (e.g. an oxide layer) over the bulk silicon 10*a*, and a silicon layer 10*c* over the insulation layer 10*b*. Forming SOI substrates is well known in the art as described above and in the U.S. patents identified above, and therefore is not further described herein. As a non-limiting example, the silicon layer 10*c* can have a thickness of 30-500 Å (Angstroms), and the insulation layer 10*b* can have a thickness of 200 Å.

Figure 2:
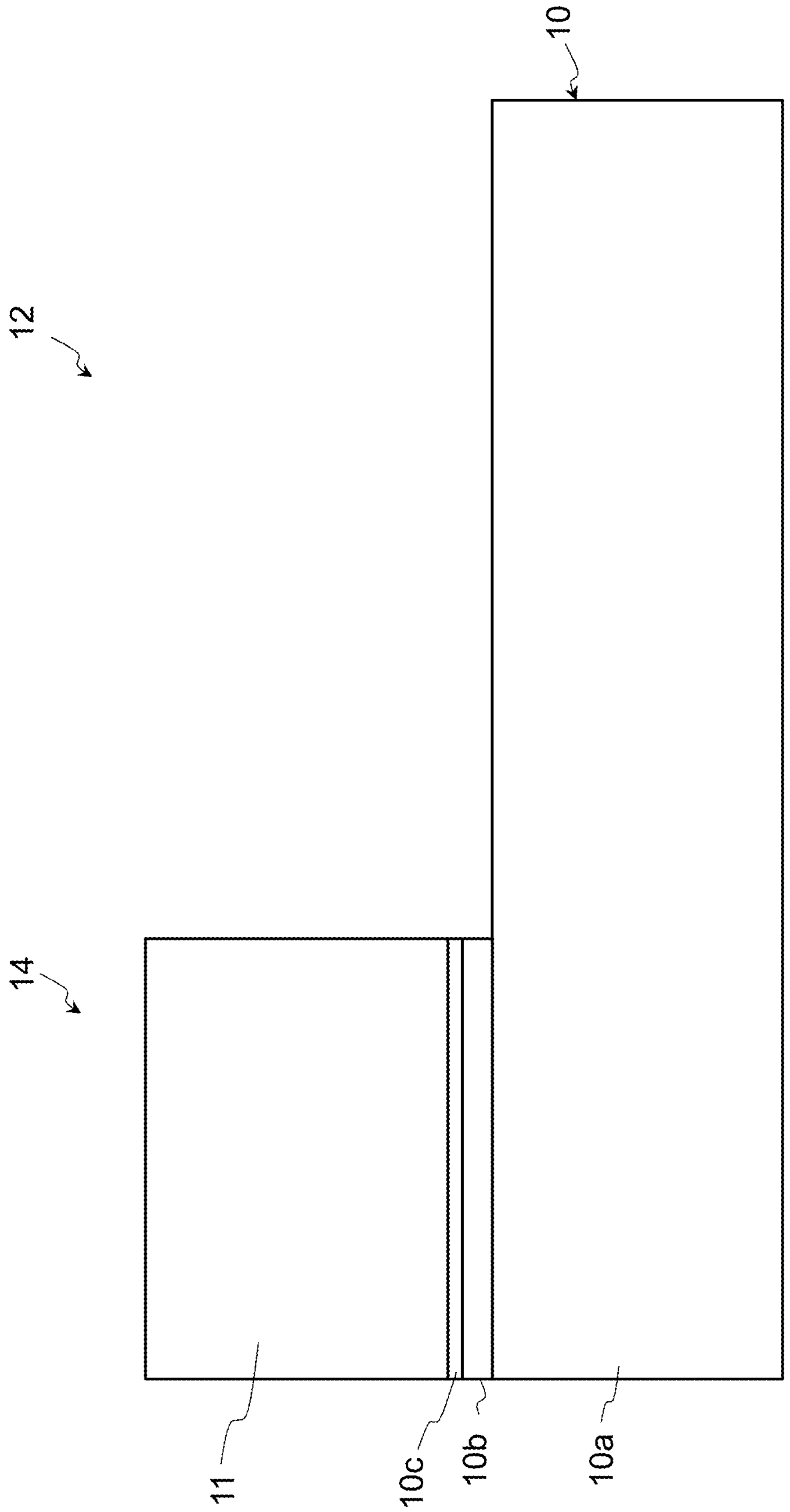
FIG. 2 is a side cross sectional view illustrating the removal of the silicon layer and the insulation layer from a portion of the silicon on insulator (SOI) substrate of FIG. 1.
Figure 3:
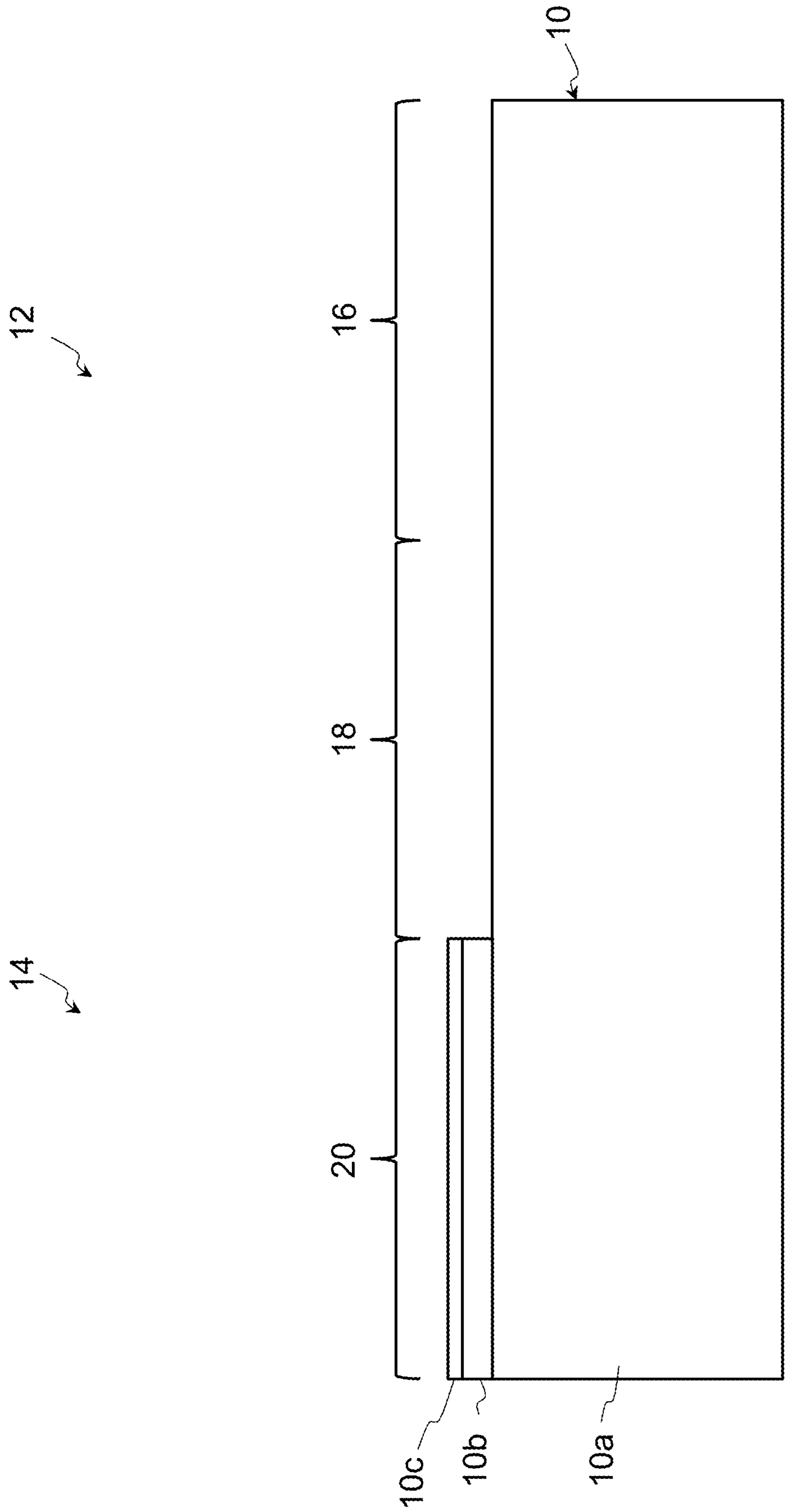
FIG. 3 is a side cross sectional view illustrating the memory cell area, the transistor device area, and the logic device area of the silicon on insulator (SOI) substrate of FIG. 2.

A photolithography process is performed which includes forming a photo-resist material 11 on silicon layer 10*c*, selective exposure of the photo-resist material 11, followed by selective removal of portions of the photo-resist material 11 to expose portions of silicon layer 10*c* in a first region 12 of the substrate 10. An etch process with one or more etches is then performed in the first region 12 to remove silicon layer 10*c* and insulation layer 10*b* from the first region 12 leaving the bulk silicon 10*a* exposed (and leaving silicon layer 10*c* and insulation layer 10*b* intact in a second region 14 of the substrate 10), as shown in FIG. 2. After photo-resist material 11 is removed, the substrate 10 can be considered to have three areas: memory cell area 16 (first area) and a transistor device area 18 (second area) (both of which are in the first region 12 in which silicon layer 10*c* and insulation layer 10*b* were removed), and a logic device area 20 (in the second region 14 in which the silicon layer 10*c* and insulation layer 10*b* were maintained), as shown in FIG. 3.

Figure 4A:
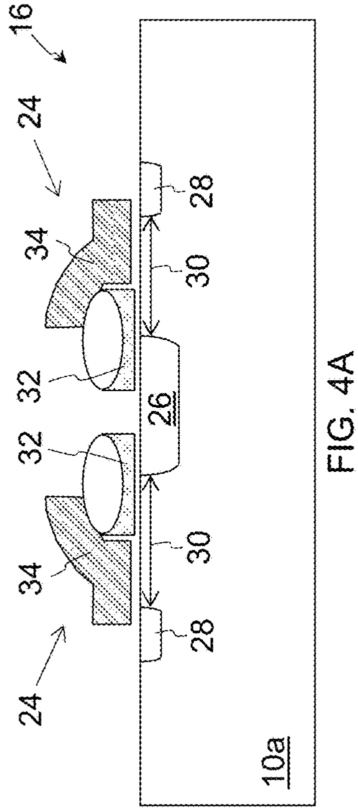
FIG. 4A is a side cross sectional view illustrating memory cells formed in the memory cell area of the silicon on insulator (SOI) substrate.

Split gate memory cells 24 are formed in the memory cell area 16, as illustrated in FIG. 4A. A respective split gate memory cell 24 includes a memory cell source region 26 and a memory cell drain region 28 formed in the bulk silicon 10*a*, with a memory cell channel region 30 of the bulk silicon 10*a* extending there between. A floating gate 32 is formed over (i.e., vertically over and laterally overlapping), and insulated from (for directly controlling the conductivity of), a first portion of the memory cell channel region 30 and partially over and insulated from the memory cell source region 26. A control gate 34 is formed having a first portion laterally adjacent to, and insulated from, the floating gate 32 and disposed over, and insulated from (for directly controlling the conductivity of), a second portion of the memory cell channel region 30. Control gate 34 includes a second portion that extends up and over the floating gate 32. As a non-limiting example, the bulk silicon 10*a* can be P-type, with the memory cell source and drain regions 26/28 being N-type. The floating gate 32 is formed of a conductive material such as polysilicon, and has a concave upper surface that terminates in a sharp edge facing the control gate 34. The control gate 34 is formed of a conductive material such as polysilicon.

Figure 4B:
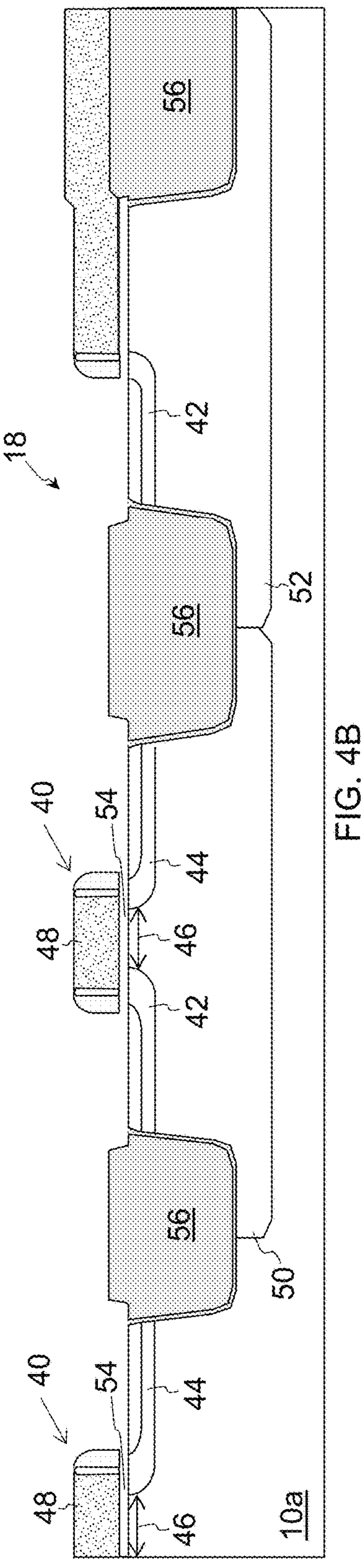
FIG. 4B is a side cross sectional view illustrating transistor devices formed in the transistor device area of the silicon on insulator (SOI) substrate.

Transistor devices 40 are formed in the transistor device area 18, as illustrated in FIG. 4B. Transistor device 40 includes a transistor source region 42 and a transistor drain region 44 formed in the bulk silicon 10*a*, with a transistor channel region 46 of the bulk silicon 10*a* extending there between. A transistor gate 48 is formed over (for directly controlling the conductivity of) the transistor channel region 46, and is insulated from the transistor channel region 46 by insulation 54. As a non-limiting example, the bulk silicon 10*a* can be P-type and include a P-type well region 50, with the transistor source and drain regions 42/44 being N-type. However, other transistor devices 40 in the same transistor device area 18 can be formed where the bulk silicon 10*a* includes an N-Type well 52, in which case the transistor source/drain regions 42/44 can be P-Type. Insulation 54 can be an oxide. Transistor devices 40 can be insulated from each other by shallow trench isolation (STI) 56, which can be insulation material such as oxide disposed in trenches formed into the substrate surface.

Figure 4C:
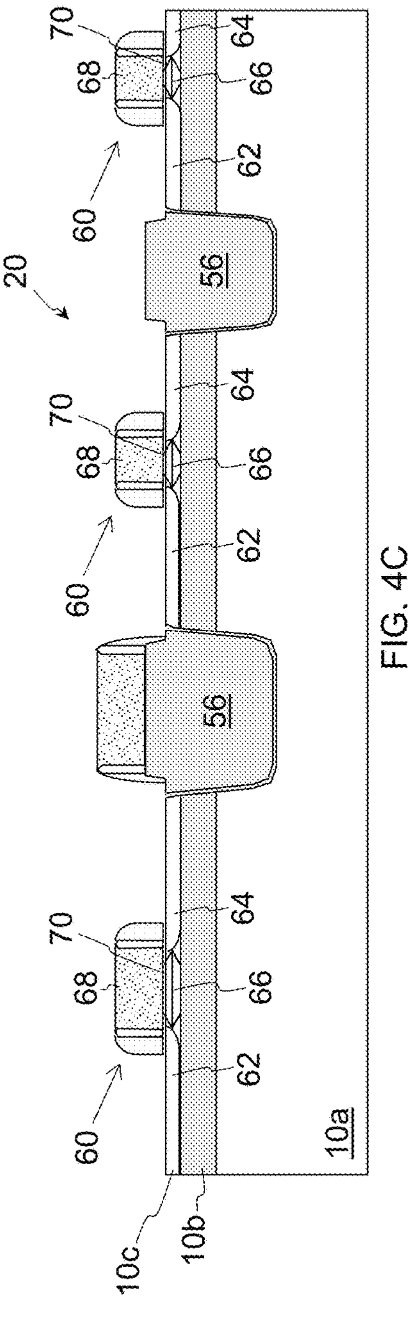
FIG. 4C is a side cross sectional view illustrating logic devices formed in the logic device area of the silicon on insulator (SOI) substrate.

Logic devices 60 are formed in the logic device area 20, as illustrated in FIG. 4C. Logic device 60 includes a logic device source region 62 and a logic device drain region 64 formed in the silicon layer 10*c*, with a logic device channel region 66 of the silicon layer 10*c* extending there between. A logic gate 68 is formed over (for directly controlling the conductivity of) the logic device channel region 66, and is insulated from the logic device channel region 66 by insulation 70. Logic devices 60 can be insulated from each other by shallow trench isolation (STI) 56.

The above technique of removing the silicon layer 10*c* and insulation layer 10*b* from the memory cell area 16 (also referred to as first area 16) and transistor device area 18 (also referred to as second area 18) while maintaining these layers in the logic device area 20 (also referred to as third area 20), and thereby forming the memory cells and the transistor devices on the bulk silicon (i.e., forming their source/drain regions in the bulk silicon), means they can be operated at higher voltages without suffering from junction breakdowns that can result if the memory cells and transistor devices were formed on silicon layer 10*c*. Forming the logic devices on the silicon layer 10*c* has the benefit of reduced silicon geometries while simplifying the manufacturing process, while providing tight electrostatic control of the logic device and reduced power consumption. To accommodate higher operational voltages for the transistor device 40 relative to the logic device 60, the insulation 54 (first insulation) under the transistor gate 48 can have a thickness that is greater than the thickness of insulation 70 (second insulation) under the logic gate 68.

It is to be understood that the present disclosure is not limited to the example(s) described above and illustrated herein, but encompasses any and all variations falling within the scope of any claims. For example, references to the present disclosure or invention or examples herein are not intended to limit the scope of any claim or claim term, but instead merely make reference to one or more features that may be covered by one or more claims. Materials, processes and numerical examples described above are exemplary only, and should not be deemed to limit the claims. Further, as is apparent from the claims and specification, not all method operations need be performed in the exact order illustrated or claimed, but rather in any order (unless there is an explicitly recited limitation on any order) that allows the proper formation of the devices described herein. Single layers of material could be formed as multiple layers of such or similar materials, and vice versa. Lastly, the terms "forming" and "formed" as used herein shall include material deposition, material growth, or any other technique in providing the material as disclosed or claimed.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming a semiconductor device, comprising:

providing a substrate that includes bulk silicon, an insulation layer over the bulk silicon, and a silicon layer over the insulation layer;

performing an etch process to remove the silicon layer and the insulation layer from a first area and a second area of the substrate to expose the bulk silicon in the first area and the second area of the substrate, while maintaining the insulation layer and the silicon layer in a third area of the substrate;

forming a memory cell in the first area by:

forming a memory cell source region and a memory cell drain region in the bulk silicon, with a memory cell channel region of the bulk silicon extending between the memory cell source region and the memory cell drain region, forming a floating gate disposed over and insulated from a first portion of the memory cell channel region, and forming a control gate disposed over and insulated from a second portion of the memory cell channel region;

forming a transistor device in the second area by:

forming a transistor source region and a transistor drain region in the bulk silicon, with a transistor channel region of the bulk silicon extending between the transistor source region and the transistor drain region, and forming a transistor gate disposed over and insulated from the transistor channel region; and forming a logic device in the third area by:

forming a logic device source region and a logic device drain region in the silicon layer, with a logic device channel region of the silicon layer extending between the logic device source region and the logic device drain region, and forming a logic gate disposed over and insulated from the logic device channel region.

2. The method of claim 1, wherein:

the transistor gate is insulated from the transistor channel region by a first insulation; and the logic gate is insulated from the logic device channel region by a second insulation;

wherein the first insulation has a thickness that is greater than a thickness of the second insulation.

3. The method of claim 1, wherein the control gate has a first portion laterally adjacent to and insulated from the floating gate and over and insulated from the second portion of the memory cell channel region, and a second portion that extends up and over the floating gate.

4. A semiconductor device, comprising:

a substrate of bulk silicon and having a first area, a second area and a third area, an insulation layer disposed over the bulk silicon, and a silicon layer disposed over the insulation layer, in the third area of the substrate, wherein the silicon layer and the insulation layer are not present in the first area and the second area of the substrate;

a memory cell in the first area comprising:

a memory cell source region and a memory cell drain region in the bulk silicon, with a memory cell channel region of the bulk silicon extending between the memory cell source region and the memory cell drain region, a floating gate disposed over and insulated from a first portion of the memory cell channel region, and a control gate disposed over and insulated from a second portion of the memory cell channel region;

a transistor device in the second area comprising:

a transistor source region and a transistor drain region in the bulk silicon, with a transistor channel region of the bulk silicon extending between the transistor source region and the transistor drain region, and a transistor gate disposed over and insulated from the transistor channel region; and a logic device in the third area comprising:

a logic device source region and a logic device drain region in the silicon layer, with a logic device channel region of the silicon layer extending between the logic device source region and the logic device drain region, and a logic gate disposed over and insulated from the logic device channel region.

5. The semiconductor device of claim 4, wherein:

the transistor gate is insulated from the transistor channel region by a first insulation; and the logic gate is insulated from the logic device channel region by a second insulation;

wherein the first insulation has a thickness that is greater than a thickness of the second insulation.

6. The semiconductor device of claim 4, wherein the control gate has a first portion laterally adjacent to and insulated from the floating gate and over and insulated from the second portion of the memory cell channel region, and a second portion that extends up and over the floating gate.

* * * * *